(12) United States Patent
Takahashi et al.

(10) Patent No.: US 6,821,806 B1
(45) Date of Patent: Nov. 23, 2004

(54) METHOD FOR FORMING COMPOUND SEMICONDUCTOR LAYER AND COMPOUND SEMICONDUCTOR APPARATUS

(75) Inventors: Koji Takahashi, Tenri (JP); Hidenori Kawanishi, Nara (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 09/786,977

(22) PCT Filed: Apr. 12, 1999

(86) PCT No.: PCT/JP99/01952

§ 371 (c)(1),
(2), (4) Date: Jun. 7, 2001

(87) PCT Pub. No.: WO00/16383

PCT Pub. Date: Mar. 23, 2000

(30) Foreign Application Priority Data

Sep. 11, 1998 (JP) .......................................... 10/259015

(51) Int. Cl.[7] .............................................. H01L 21/00
(52) U.S. Cl. ........................................ 438/46; 438/483
(58) Field of Search ............................ 438/29, 46, 483, 438/503, 507; 257/103, 200, 201, 615

(56) References Cited

U.S. PATENT DOCUMENTS

| | | | |
|---|---|---|---|
| 5,587,014 A | 12/1996 | Iyechika et al. | |
| 5,689,123 A | * 11/1997 | Major et al. | 257/190 |
| 5,904,597 A | 5/1999 | Doi et al. | |
| 5,937,274 A | * 8/1999 | Kondow et al. | 438/47 |
| 6,204,084 B1 | * 3/2001 | Sugiura et al. | 438/46 |

FOREIGN PATENT DOCUMENTS

| | | |
|---|---|---|
| DE | 19531132 A | 3/1996 |
| EP | 0617 491 A2 | 3/1994 |
| GB | 2309582 A | 7/1994 |
| JP | 04-167531 | 6/1992 |
| JP | 06-37355 | 2/1994 |
| JP | 07-263857 | 10/1995 |
| JP | 09-205254 | 8/1997 |
| JP | 09-283857 | 10/1997 |
| JP | 11-017284 | 1/1999 |

OTHER PUBLICATIONS

Mendoza–Diaz, G. et al. (1997). "Feasibility of the Synthesis of AlAsN and GaAsN Films by Plasma–source Molecular–beam Epitaxy," *Journal of Crystal Growth* 178(1–2):45–55.

Qui, Y. et al. (1998). "Metalorganic Molecular Beam Epitaxy of GaAsN with Dimethylhydrazine," *Applied Physics Letters* 72(16).

Sakai, Shiro et al. (1998). "Growth of InNAs on GaAs(1 0 0) Substrates by Molecular–beam Epitaxy," Journal of Crystal Growth 189/190:471–475.

Uesugi, Katsuhiro et al. (1998). "Metalorganic Molecular Beam Epitaxy of GaNAs Alloys on ( 0 0 1)GaAs," *Journal of Crystal Growth* 189/190:490–495.

(List continued on next page.)

*Primary Examiner*—Kevin M. Picardat
(74) *Attorney, Agent, or Firm*—Morrison & Foerster LLP

(57) ABSTRACT

Includes the step of crystal-growing a group III–V compound semiconductor layer containing at least nitrogen and arsenic as group V elements on a single crystal substrate. The step of crystal-growing the compound semiconductor layer includes the stop of supplying a nitrogen source material to the single crystal substrate so that the nitrogen source material interacts with aluminum at least on a crystal growth surface of the compound semiconductor layer. Thus, a method is provided for forming a group III–V compound semiconductor layer containing a group III–V compound semiconductor containing arsenic as a group V element and also containing nitrogen mix-crystallized therewith, which has superb light emission characteristics.

31 Claims, 9 Drawing Sheets

OTHER PUBLICATIONS

Nakahara, K. et al., (Apr., 1998) "1.3–$\mu$m Continuous–Wave Lasing Operation in GaInNAs Quantum–Well Lasers," *Photonics Technology Letters 10(4)*: 487–488.

Tanaka, S. et al. (1998) "Improvement of Optical Properties of GaNAs Epitaxial Films by Thermal Annealing," *Jpn. J. Appl. Phys. 28p–ZM–12:290* (Abstract only).

Uesugi, K. and Suemune, I. (1997) "Bandgap Energy of GaNAs Alloys Grown on (001) GaAs by Metalorganic Molecular Beam Epitaxy," *Jpn. J. Appl. Phys. 36(12A):L1572–L1575*.

* cited by examiner

METHOD FOR FORMING COMPOUND SEMICONDUCTOR LAYER AND COMPOUND SEMICONDUCTOR APPARATUS

This application is a 35 U.S.C. §371 filing of International Patent Application No. PCT/JP99/01952, filed Apr. 12, 1999. This application claims priority benefit of Japanese Patent Application No. 10-259015, filed Sep. 11, 1998.

TECHNICAL FIELD

The present invention relates to a method for forming a compound semiconductor layer, and more specifically to a method for forming a group III–V compound semiconductor layer containing at least nitrogen and arsenic as a group V element.

BACKGROUND ART

Recently, as group III–V compound semiconductor materials having a significantly wider field of use as optoelectronics materials, group III–V compound semiconductor materials containing arsenic as a group V element (GaAs, GaInAs, etc.) and nitrogen mix-crystallized therewith have been proposed.

Japanese Laid-Open Publication No. 6-37355 (first conventional example) discloses $Ga_{1-y}In_yN_zAs_{1-z}$-based compound mix crystal semiconductor materials (z=about 0.04) as new semiconductor materials which are lattice-matched to a GaAs substrate. It is shown that use of such semiconductor materials allows a semiconductor laser for emitting light in a long wavelength band (1.3 to 1.55 $\mu$m) to be produced on a low-cost GaAs substrate, which is conventionally impossible.

PHOTONICS TECHNOLOGY LETTERS, VOL. 10, NO. 4, April 1998, page 487 (second conventional example) discloses producing a semiconductor laser structure on a GaAs substrate. The semiconductor laser structure includes an active layer formed of a quantum well layer which is formed of $Ga_{0.7}In_{0.3}N_{0.01}As_{0.99}$ and a guide layer, and the active layer is held between upper and lower cladding layers formed of $Al_{0.3}Ga_{0.7}As$. It is reported that such a semiconductor laser realizes continuous oscillation for light having a wavelength of 1.31 $\mu$m at room temperature. This is the first report that such a continuous oscillation is realized by a semiconductor laser formed of materials lattice-matched to a GaAs substrate.

For crystal growth of these new semiconductor materials, a molecular beam epitaxy (MBE) method or an metal organic chemical vapor deposition (MOCVD) method is used. Usable nitrogen source materials include, for example, dimethylhydrazine (DMeHy) and nitrogen gas ($N_2$) activated by plasma. Crystal growth is conducted by concurrently supplying Ga, In and As source materials and the nitrogen source material(s) described above.

Such group III–V compound crystal semiconductor materials containing a group III–V compound semiconductor having arsenic as a group V element and also containing nitrogen as a group V element mix-crystallized therewith have not been actively studied until recently. The reason is that it is difficult to grow crystals of such semiconductor materials.

For example, GaAsN is considered to be a mix crystal of GaN containing only N as a group V element and GaAs containing only arsenic as a group V element. This mix crystal system have a very large immiscible region (misciblity gap). Therefore, it is difficult even to introduce only several percent of N with GaAs. Thus, it is necessary to carefully select a method and conditions for crystal growth. It is reported that especially introducing nitrogen with GaAs is significantly influenced by a substrate temperature during crystal growth. As a substrate temperature for such crystal growth, about 500° C. is usually selected. The temperature of 500° C. is relatively low as a crystal growth temperature of a group III–V compound semiconductor.

Jpn. J. Appl. Phys. Vol. 36, No. 12A, December 1997, page L1572 (third conventional example) shows correlation between the substrate temperature during crystal growth and a nitrogen-mix crystal ratio in the crystal in the case where GaAsN containing monomethylhydrazine (MMeHy) as an N source material in crystal-grown. When the substrate temperature is lower than 500° C., MMeHy is not sufficiently thermally decomposed. Therefore, only a small amount of nitrogen is introduced. By contrast, when the substrate temperature is higher than 500° C., the nitrogen source material is thermally evaporated significantly, such that nitrogen is not introduced into GaAs. It is reported that N can be introduced into the crystal most efficiently at a substrate temperature of about 500° C. for these reasons. In the second conventional example, plasma-decomposed $N_2$ is used as a nitrogen source material. In this example also, about 500° C. is selected as a crystal growth temperature.

Novel compound semiconductor materials containing nitrogen mix-crystallized with, for example, GaAs or GaInAs are used for an active layer of a semiconductor laser. One such example is described above, in which a GaInNAs layer is used for an active layer of a semiconductor laser. A semiconductor laser using such a compound semiconductor material does not necessarily provide superior light emission characteristics over an equivalent structure using a compound semiconductor material not containing nitrogen. For example, in the publication showing the above-described second conventional example, semiconductor lasers having structures similar to one another are produced. One of these semiconductor lasers uses GaInAs not containing nitrogen for an active layer (quantum well), and the other semiconductor laser uses GaInNAs containing nitrogen. It is reported that when 1% of nitrogen is contained, the oscillation threshold current becomes four times larger and the light emission efficiency is reduced to about ⅔. It is also reported that when a small amount of nitrogen is contained, the light emission efficiency is drastically reduced.

As one cause of reduction in the light emission efficiency, it can be pointed out that the crystal growth temperature is too low according to the conventional crystal growth method and therefore crystals having sufficient crystallinity are not obtained.

For example, in the case of GaAsN, a crystal is produced by introducing N into GaAs by causing crystal growth to proceed in a state of non-equilibrium at a low growth temperature (about 500° C.). Such a crystal cannot be produced in a state of thermal equilibrium. GaAsN can be considered to be a mix crystal of GaAs and GaN. The optimum growth temperature of GaAs is 600° C. to 750° C., and the optimum growth temperature of GaN is 900 to 1000° C. As compared to these temperatures, about 500° C. cannot be considered to be the optimum growth temperature for GaAsN-based compound mix crystal semiconductor materials.

It is assumed, for example, that in a semiconductor laser including an active layer and upper and lower cladding layers sandwiching the active layer, the active layer is formed of GaInNAs and the upper and lower cladding layers are formed of, for example, AlGaAs, GaInP, InGaAsP or AlGaInP. For producing such a semiconductor laser, the crystal growth temperature for the upper and lower cladding layers formed of $Al_hGa_iIn_{1-h-i}As_jP_{1-j}$ ($h \geq 0, i > 0, j \geq 0$) is usually set to be a low substrate temperature (about 500° C.) in conformity with the crystal growth temperature for the GaInNAs active layer. As described above, the cladding layers crystal-grown at such a low substrate temperature do not have sufficient crystallinity. Unless the lower cladding layer formed of $Al_hGa_iIn_{1-h-i}As_jP_{1-j}$ ($h \geq 0, i > 0, j \geq 0$) which acts as an underlying layer of the GaInNAs active layer has sufficient crystallinity, the crystal defect of the lower cladding layer is transferred to the GaInNAs active layer which is crystal-grown on the lower cladding layer. Accordingly, when a laser structure is produced at such a low temperature, satisfactory light emission characteristics cannot be provided, and the laser device deteriorates quickly. Such a conventional low temperature crystal growth method is considered to be performed in order to meet a requirement for provision of a novel material by introducing nitrogen rather than a requirement for improvement in the light emission characteristics by growth of GnAsN or GaInNAs at a high temperature.

As an attempt to improve light emission characteristics, there is a report on the effect of heat treatment performed after the crystal growth. The abstract of Jpn. J. Appl. Phys. Spring 1998, 28p-ZM-12 reports that the light emission intensity becomes 25 times higher by heating GaAsN (nitrogen composition ratio: 0.79%) at 700° C. for 10 minutes in a hydrogen atmosphere. However, the studies of the present inventors found that the laser characteristics of a semiconductor laser using GaInNAs for an active layer cannot be improved to a practically usable level by merely performing heat treatment after the crystal growth. The studies of the present inventor also found that means for providing a satisfactory crystal structure during crystal growth is necessary instead of such a treatment performed after the crystal growth.

DISCLOSURE OF THE INVENTION

The present invention has an objective of solving the above-described problems. Namely, it is an objective of the present invention to provide a method for forming a group III–V compound semiconductor layer containing a group III–V compound semiconductor having arsenic as a group V element and also containing nitrogen mix-crystallized therewith, the group III–V compound semiconductor layer having satisfactory light emission characteristics.

A method for forming a compound semiconductor layer according to the present invention includes the step of crystal-growing a group III–V compound semiconductor layer containing at least nitrogen and arsenic as group V elements on a single crystal substrate. The step of crystal-growing the compound semiconductor layer includes the step of supplying a nitrogen source material to the single crystal substrate so that the nitrogen source material interacts with aluminum at least on a crystal growth surface of the compound semiconductor layer.

In another aspect of the invention, a method for forming a compound semiconductor layer according to the present invention includes the step of crystal-growing a group III–V compound semiconductor layer containing at least nitrogen and arsenic as group V elements on a single crystal substrate. The step of crystal-growing the compound semiconductor layer includes the step of supplying an aluminum source material to the single crystal substrate concurrently with a nitrogen source material.

In still another aspect of the invention, a method for forming a compound semiconductor layer according to the present invention includes the step of crystal-growing a group III–V compound semiconductor layer containing at least nitrogen and arsenic as group V elements on a single crystal substrate. The step of crystal-growing the compound semiconductor layer includes the step of supplying a nitrogen source material to a crystal surface of the compound semiconductor layer in a state where the group III atoms containing aluminum are exposed to the crystal surface.

In one preferable embodiment, an aluminum-mix crystal ratio in a group III element in the compound semiconductor layer in 0.02 or higher.

In one preferable embodiment, the step of crystal-growing the compound semiconductor layer is performed at a temperature of the single crystal substrate in the range of 500° C. or higher and 750° C. or lower, and more preferably in the range of 600° C. or higher and 750° C. or lower.

In one preferable embodiment, the nitrogen source material contains

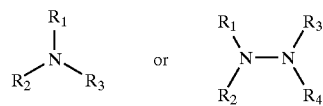

where $R_1$, $R_2$, $R_3$ and $R_4$ are hydrogen or a lower alkyl group.

In one preferable embodiment, more than 0% and less than 50% of the crystal growth surface of the compound semiconductor layer is covered with group V atoms.

In one preferable embodiment, the step of crystal-growing the compound semiconductor layer further includes the step of supplying a group III source material containing aluminum and the step of supplying an arsenic source material, wherein a process sequentially including the step of supplying the group III source material, the step of supplying the nitrogen source material, and the step of supplying the arsenic source material is performed at least once.

In one preferable embodiment, the single crystal substrate has a {100} plane as a principal plane.

In one preferable embodiment, the step of crystal-growing a layer formed of $Al_hGa_iIn_{1-h-i}As_jP_{1-j}$ ($h \geq 0$, $i > 0$, $j \geq 0$) on the single crystal substrate is further included. The step of crystal-growing the compound semiconductor layer and the step of growing the crystal formed of $Al_hGa_iIn_{1-h-i}As_jP_{1-j}$ are performed at the same temperature.

In one preferable, embodiment, the step of crystal-growing the compound semiconductor layer is performed after the step of crystal-growing the layer formed of $Al_hGa_iIn_{1-h-i}As_jP_{1-j}$.

In one preferable embodiment, the step of crystal-growing the compound semiconductor layer is performed before the step of crystal-growing the layer formed of $Al_hGa_iIn_{1-h-i}As_jP_{1-j}$.

In one preferable embodiment, the compound semiconductor layer further contains indium.

A compound semiconductor apparatus according to the present invention includes at least one group III–V compound semiconductor layer containing at least nitrogen and arsenic as group V elements. The compound semiconductor layer is formed in accordance with any one of the methods for forming a compound semiconductor layer described above.

In one preferable embodiment, the compound semiconductor apparatus in a light emitting device including at least a light emitting layer, and the light emitting layer includes the compound semiconductor layer.

In one preferable embodiment, the light emitting layer is formed of $Al_xGa_yIn_{1-x-y}N_zAs_{1-z}$ (0.<x, y, z<1), and an Al-mix crystal ratio x in the light emitting layer is 0.02 or higher and 0.20 or lower, and more preferably 0.02 or higher and 0.10 or lower.

In one preferable embodiment, the light emitting device further includes a cladding layer, a guide layer and/or a barrier layer formed of $Al_hGa_iIn_{1-h-i}As_jP_{1-j}$ (h≧0, i>0, j≧0).

Hereinafter, the function of the present invention will be described.

According to the present invention, a nitrogen source material is supplied to a single crystal substrate so that the nitrogen source material interacts with aluminum at least on a crystal growth surface of a compound semiconductor layer. Therefore, a decomposition reaction of the nitrogen source material on the surface of the substrate is promoted, and thus thermal evaporation of nitrogen is suppressed. Consequently, even when the crystal growth temperature is raised to be relatively high (600° C. or higher and 750° C. or lower), a sufficient amount of nitrogen is introduced. As a result, a crystal having satisfactory crystallinity and especially satisfactory light emission characteristics can be provided. A crystal formed of AlGaAs, GaInP, InGaAsP or AlGaInP has satisfactory crystallinity as a result of being crystal-grown at a relatively high temperature which is equal to the above crystal growth temperature. Accordingly, for producing a multi-layer film containing such a crystal layer on at least one surface of a group III–V compound semiconductor crystal layer, the growth temperature of the group III–V compound semiconductor crystal can be adjusted to be in a temperature range which is optimum for the above-described materials. Thus, the growth temperature of the multi-layer film can be maintained so as to be high. Therefore, a hetero junction of high quality crystals can be formed.

BEST MODE FOR CARRYING OUT THE INVENTION

Examples of the present invention will be described in detail together with Comparative examples.

EXAMPLE 1

Figure 1:
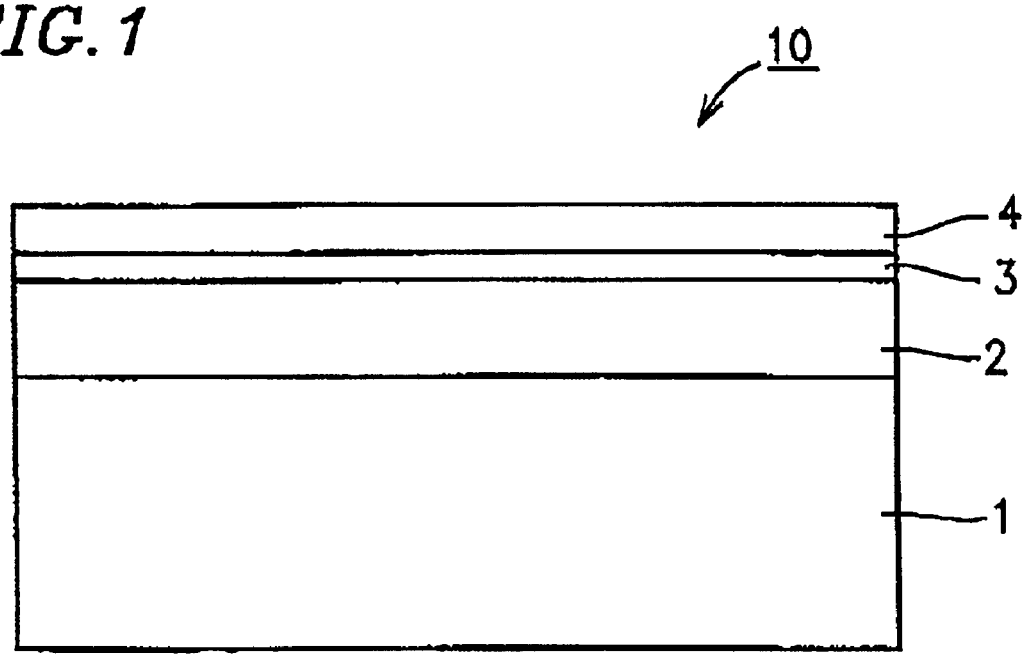
FIG. 1 is a schematic cross-sectional view illustrating a single quantum well structure produced in Examples 1 through 15 and 17 through 19, and Comparative examples 1 through 14.

In this example, as shown In FIG. 1, a multi-layer film 10 having a single quantum well structure its crystal-grown on a GaAs substrate 1 using an MBE (molecular beam epitaxy) method. The multi-layer film 10 includes an $Al_{0.5}Ga_{0.5}As$ lower barrier layer 2 having a thickness of about 0.5 μm, an $Al_{0.05}Ga_{0.95}N_{0.015}As_{0.065}$ well layer (light emission layer) 3 having a thickness of about 6 nm, and an $Al_{0.5}Ga_{0.5}As$ upper barrier layer 4 having a thickness of about 0.1 μm, which are laminated.

Hereinafter, a method for forming a compound semiconductor layer in this example will be described. The method is different from the conventional methods in that an appropriate amount of Al source material is added during the crystal growth of the light emission layer in this example.

An MBE apparatus containing metal Ga, metal Al and As, as solid sources, and DMeHy (dimethylhydrazine) as a gas source was used to supply these materials to a chamber. The substrate 1 was irradiated with a molecular beam of each source material while maintaining the temperature of the GaAs substrate 1 having a {100} plane as a principal plane at 650° C., thereby performing crystal growth. Thus, the single quantum well structure shown in FIG. 1 was produced. The strength of each molecular beam for crystal growth by the MBE method was as follows: Ga: about $3.6 \times 10^{-7}$ torr; Al: about $1.9 \times 10^{-8}$ torr for growing the well layer 3 and about $3.3 \times 10^{-9}$ torr for growing the barrier layers 2 and 4: $As_4$: about $4.7 \times 10^{-6}$ torr; and DMeHy: about $3.6 \times 10^{-6}$ torr. Throughout the crystal growth process, all the necessary source materials were concurrently supplied. Especially for producing the AlGaNAs well layer 3, it was important to concurrently supply Al and DMeHy as described below with reference to FIGS. 2 through 4.

In this manner, the $Al_{0.5}Ga_{0.5}As$ lower barrier layer 2, the $Al_{0.05}Ga_{0.95}N_{0.015}As_{0.065}$ well layer (light emission layer) 3, and the $Al_{0.5}Ga_{0.5}As$ upper barrier layer 4 were sequentially crystal-grown on the GaAs substrate 1. In the light emission layer 3 of the multi-layer film 10, the aluminum-mix crystal ratio was 0.05, and the nitrogen-mix crystal ratio was 0.015. The composition of $Al_{0.05}Ga_{0.95}N_{0.015}As_{0.065}$ forming the well layer 3 has an about −0.3% of tensile strain with respect to the GaAs substrate.

An a result of measuring photoluminescence of the thus produced multi-layer film at room temperature, it was confirmed that the multi-layer film emits light having a wavelength of about 1.26 μm and that the produced $Al_{0.5}Ga_{0.5}As/AlGaNAs/Al_{0.5}Ga_{0.5}As$ structure has a single quantum well structure. The half width of the emission spectrum was sufficiently small at 25 meV. There was no non-uniformity in the light emission wavelength or light emission intensity in the sample surface, and the surface was highly smooth. Thus, it was confirmed that a high quality crystal is obtained.

EXAMPLES 2 THROUGH 5

Figure 2:
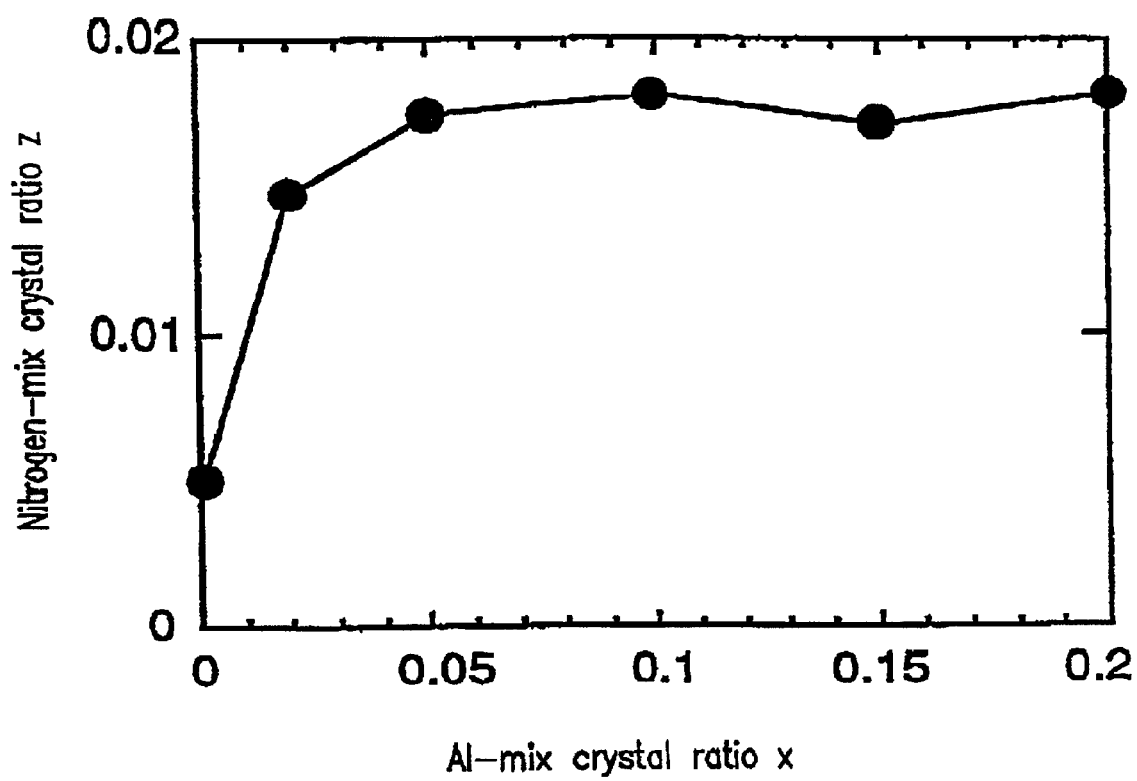
FIG. 2 is a graph illustrating the dependency of the nitrogen-mix crystal ratio of a well layer on the Al-mix crystal ratio, the well layer being crystal-grown in Examples 1 through 5 and Comparative example 1 at a constant growth temperature under constant source supply conditions.

Multi-layer films were produced in a similar manner to that of Example 1 except that the strength of the molecular beam of the Al source material (metal Al) during the growth of the well layer in the crystal growth process was adjusted to about $7.3 \times 10^{-9}$ torr; about $4.0 \times 10^{-8}$ torr, about $6.3 \times 10^{-8}$ torr and about $8.8 \times 10^{-8}$ torr so as to provide Al-mix crystal ratios of 0.02, 0.1, 0.15 and 0.2, respectively. The measurement results of the nitrogen-mix crystal ratios in the well layer of these multi-layer films are shown in FIG. 2.

Comparative example 1

A multi-layer film was produced in a similar manner to that of Example 1 except that the Al-mix crystal ratio was zero by not supplying Al source material during the crystal growth process. The nitrogen-mix crystal ratio in the well layer of the multi-layer film is shown in FIG. 2.

Hereinafter, Examples 1 through 5 and Comparative example 1 will be discussed with reference to FIG. 2. FIG. 2 is a graph illustrating the dependency of the nitrogen-mix crystal ratio in the well layer on the supply amount of Al when crystal growth was performed under constant source supply conditions. When the Al source material was added in such an amount that the Al-mix crystal ratio in solid phase substantially exceeded 2% (Al-mix crystal ratio x=0.02), the introduction amount of nitrogen increased and thus the effect of adding the Al source material was exhibited.

EXAMPLES 6 THROUGH 9

Figure 3:
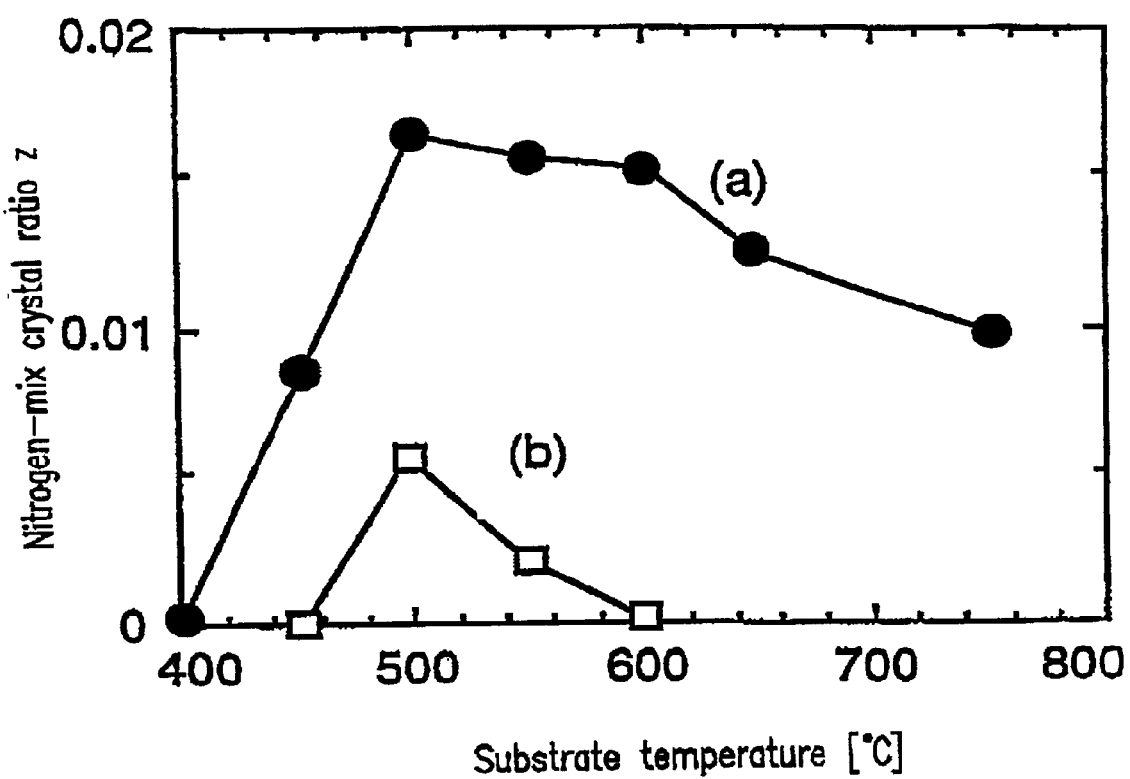
FIG. 3 is a graph illustrating the dependency of the nitrogen-mix crystal ratio of a well layer on the growth temperature, the well layer being crystal-grown under constant source supply conditions. Line (a) is a plot of the results of Examples 1, 6 through 9 and Comparative examples 2 and 3 in which an Al source material is contained, and line (b) is a plot of the results of Comparative examples 4 through 7 in which no Al source material is contained.

Multi-layer films were produced in a similar manner to that of Example 1 except that the substrate temperature during the crystal growth process was set to be 500° C., 550° C., 600° C. and 750° C., respectively. The measurement results of the nitrogen-mix crystal ratio in the well layer of these multi-layer films are shown in FIG. 3.

Comparative Examples 2 and 3

Multi-layer films were produced in a similar manner to that of Example 1 except that the substrate temperature during the crystal growth process was set to be 400° C. and 450° C., respectively. The measurement results of the nitrogen-mix crystal ratios in the well layer of these multi-layer films are shown in FIG. 3.

Comparative Examples 4 through 7

Multi-layer films were produced in a similar manner to that of Example 1 except that no Al source material was supplied and that the substrate temperature during the crystal growth process was set to be 450° C., 500° C., 550° C. and 600° C., respectively. The measurement results of the nitrogen-mix crystal ratios in the well layer of these multi-layer films are shown in FIG. 3.

Hereinafter, Examples 1, 6 through 9 and Comparative examples 2 through 7 will be discussed with reference to FIG. 3.

FIG. 3 is a graph illustrating the dependency of the nitrogen-mix crystal ratio in the well layer on the growth temperature. In the figure, line (a) is a plot of the results of Examples 1, 6 through 9 and Comparative examples 2 through 3 in which Al was contained: and line (b) is a plot of the results of Comparative examples 4 through 7 in which Al was not contained.

When Al was not contained, the nitrogen-mix crystal ratio was maximum at the substrate temperature of about 500° C., and the nitrogen-mix crystal ratio was lower when the substrate temperature was either higher or lower than this. In samples obtained by performing crystal growth at 450° C. and 600° C., the nitrogen-mix crystal ratio was not detected in an amount which can be detectable as a part of the composition. The reason is that when the substrate temperature is too low, the source material is not sufficiently thermally decomposed; and when the substrate temperature is too high, the nitrogen source material, which is physically adsorbed to the mix crystal is thermally evaporated. In the case where nitrogen is contained in a compound semiconductor containing indium as a group III element, it is difficult to raise the substrate temperature.

In the case where Al was contained, the introduction amount of nitrogen was maximum at the substrate temperature of 500° C. as in the case where no Al was contained. However, even when the substrate temperature was higher than this, the introduction amount of nitrogen was not significantly reduced. It was found from FIG. 3 that when Al was contained, the introduction amount of nitrogen was improved in the range of the substrate temperature of 450° C. through 750° C., as compared to the case where no Al was contained. It was also found that the substrate temperature can be raised to the vicinity of 600 to 750° C., which is the optimum growth temperature range for AlGaAs, InGaP, InGeAsP, AlGaInP and the like. The nitrogen-mix crystal ratio was high even at a substrate temperature of lower than 500° C. (for example, 450° C.) when Al was contained, unlike when Al was not contained, for the following reason. Since the Al source material, which has a high reactivity, was supplied concurrently with the nitrogen source material, decomposition of the source materials on the surface of the substrate was promoted. The nitrogen-mix crystal ratio was increased when the substrate temperature was higher than 500° C. and also was unlikely to be reduced in accordance with a rise in the substrate temperature. unlike when Al was not contained, for the following reason. Since Al is not substantially thermally evaporated, a crystal containing Al itself is unlikely to be thermally etched. Specifically, generation of Al-N bonds having a strong bonding force during the crystal growth suppresses thermal leaving of nitrogen. When the substrate temperature was higher than 750° C., thermal evaporation of Ga was excessive, and thus it was difficult to produce a crystal having a flat surface.

EXAMPLE 10

A multi-layer film was produced in a similar manner to that of Example 1 except that the strength of the molecular beam of the N source material (DMeHy) during the crystal growth was adjusted to be about $2.4 \times 10^{-6}$ torr so as to provide a nitrogen-mix crystal ratio of 0.01.

Figure 4:
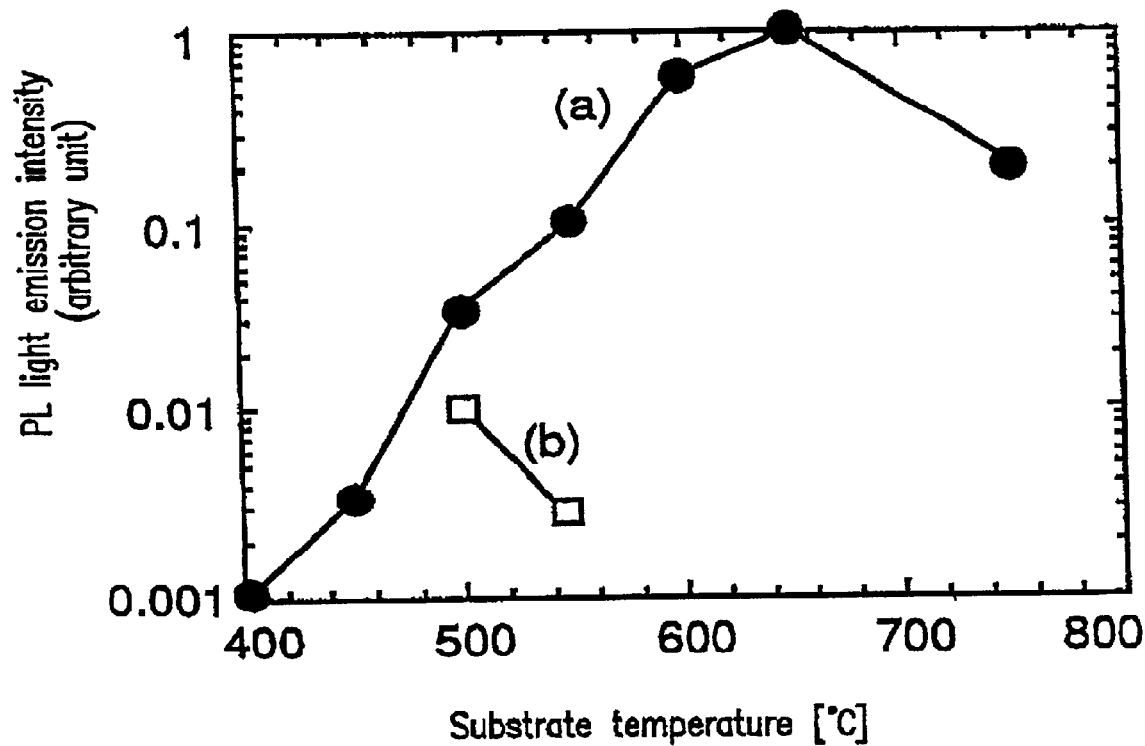
FIG. 4 is a graph illustrating the dependency of photoluminescence light emission intensity of a crystal containing 1% of nitrogen mix-crystallized (z=0.01) on the growth temperature. Line (a) is a plot of the results of Examples 10 through 14 and Comparative examples 8 and 9 in which an Al source material is contained, and line (b) is a plot of the results of Comparative examples 10 and 11 in which no Al source material is contained.

The measurement result of photoluminescence light emission intensity of this multi-layer film is shown in FIG. 4 as value "1".

EXAMPLES 11 THROUGH 14

Multi-layer films were produced in a similar manner to that of Example 10 except that the substrate temperature during the crystal growth was set to be 500° C., 550° C., 600° C. and 750° C. respectively and that the strength of the molecular beam of the nitrogen source material (DMeHy) was appropriately changed in order to provide a nitrogen-mix crystal ratio of 0.01 as in Example 10. The measurement results of photoluminescence light emission intensity of these multi-layer films are shown in FIG. 4, with the results of Example 10 used as a reference.

Comparative Examples 8 and 9

Multi-layer films were produced in a similar manner to that of Example 10 except that the substrate temperature during the crystal growth was set to be 400° C. and 450° C. respectively and that the strength of the molecular beam of the nitrogen source material (DMeHy) was appropriately changed in order to provide a nitrogen-mix crystal ratio of 0.01 as in Example 10. The measurement results of photoluminescence light emission intensity of these multi-layer films are shown in FIG. 4, with the results of Example 10 used as a reference.

Comparative Examples 10 and 11

Multi-layer films were produced in a similar manner to that of Example 10 except that no Al source material was supplied, that the substrate temperature during the crystal growth was set to be 500° C. and 550° C. respectively, and that the strength of the molecular beam of the nitrogen source material (DMeHy) was appropriately changed in order to provide a nitrogen-mix crystal ratio of 0.01 as in Example 10. The measurement results of photolumineasence light emission intensity of these multi-layer films are shown in FIG. 4, with the results of Example 10 used as a reference.

Hereinafter, Examples 10 through 14 and Comparative examples 8 through 11 will be discussed with reference to FIG. 4.

FIG. 4 is a graph illustrating the dependency of the photoluminescence light emission intensity of a crystal containing 1% of nitrogen (z: 0.01) on the growth temperature. In the figure, line (a) is a plot of the results of Examples 10 through 14 and Comparative examples 8 and 9 in which Al was contained; and line (b) is a plot of the results of Comparative examples 10 and 11 in which Al was not contained.

When Al was not contained, as can be appreciated from FIG. 3. at a substrate temperature of higher than 550° C., it was difficult to introduce nitrogen and therefore it was difficult to produce a crystal itself. As can be appreciated from FIG. 4, at a substrate temperature of higher than 550° C., it was difficult to grow a crystal and therefore the light emission intensity was reduced. When Al was contained, as can be appreciated from FIG. 3, crystal growth is possible at a substrate temperature of up to 750° C. Thus, a sufficient amount of nitrogen can be introduced even at a high substrate temperature. From FIG. 4, it was found that the light emission intensity is improved than when Al was not contained in the range of the substrate temperature of 500° C. to 750° C. It was found that the light emission intensity is high especially at a substrate temperature of 600° C. or higher. In the conventional methods, priority was put on increasing the introduction amount of nitrogen, and for this purpose, crystal growth was intentionally performed at a low substrate temperature (500° C.) so as to cause the crystal growth to proceed in a more non-equilibrium state. According to the present invention, unlike the conventional methods, nitrogen can be introduced at a higher temperature. Therefore, crystal growth can be performed in a temperature range which is close to an optimum growth temperature for GaAsN-based mix crystal materials.

As described above, as can be appreciated from Examples 1, 6 through 9, Comparative examples 2 through 7. Examples 10 through 14, and Comparative examples 8 through 11 with reference to FIGS. 3 and 4, the substrate temperature at which a sufficient amount of nitrogen can be introduced and satisfactory light emission characteristics are obtained is 500° C. or higher and 750° C. or lower, and more preferably 600° C. or higher and 750° C. or lower.

Comparative Examples 12 through 14

Figure 5:
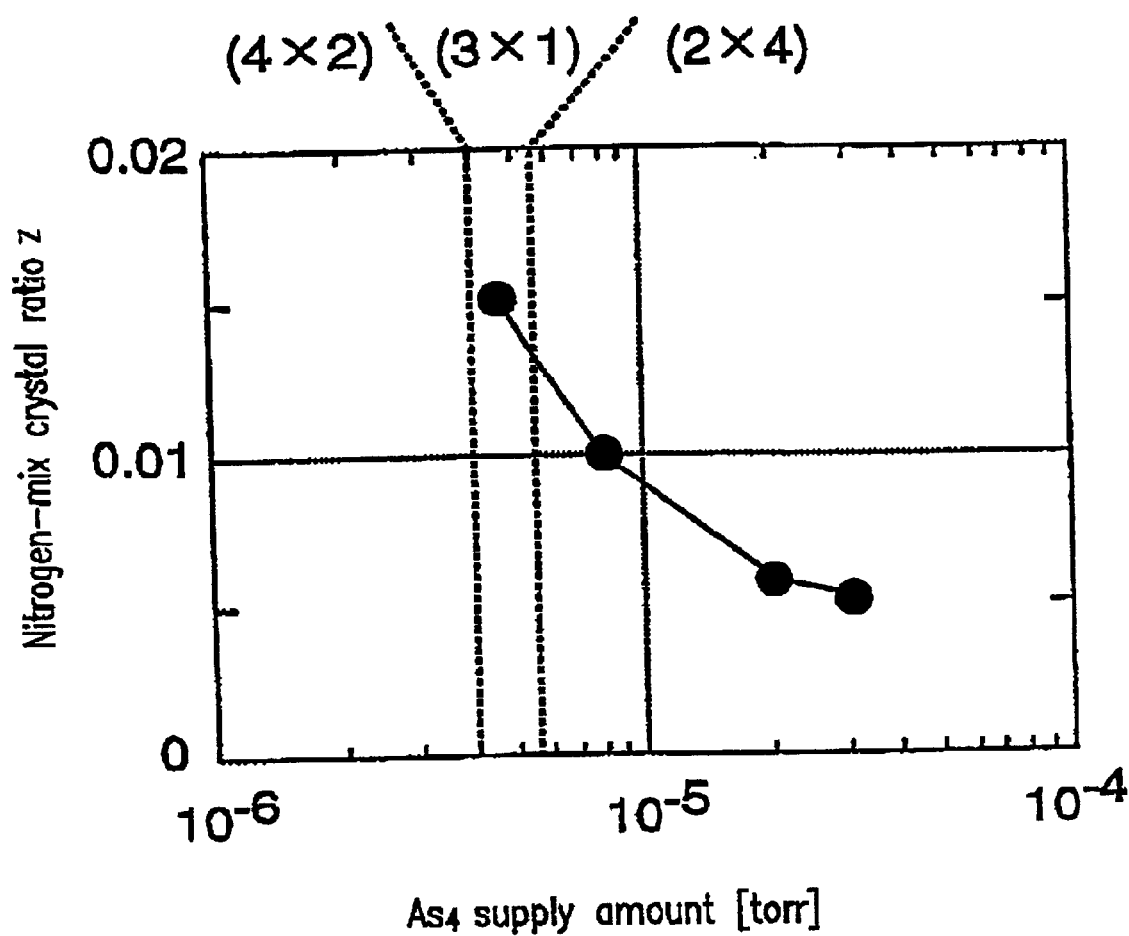
FIG. 5 is a graph illustrating a change in the concentration of nitrogen which in introduced in a film when the supply amount of As changes while the growth temperature and supply amounts of source materials other than As are maintained in Example 1 and Comparative examples 12 through 14.

Multi-layer films were produced in a similar manner to that of Example 1 except that the strength of the molecular beam of $As_4$ during the crystal growth process was set to be about $8.0 \times 10^{-5}$ torr, about $2.0 \times 10^{-5}$ torr, and $3.0 \times 10^{-5}$ torr, respectively. The measurement results of the nitrogen-mix crystal ratios in the well layer of these multi-layer films are shown in FIG. 5. From the results of a RHEED observation, the surface reconstruction was (2×4) (about 75% of the crystal growth surface was covered with arsenic and nitrogen as group V elements).

Hereinafter, Example 1 and Comparative examples 12 through 14 will be discussed with reference to FIG. 5. FIG. 5 is a graph illustrating the nitrogen-mix crystal ratio in a well layer when the supply amount of $As_4$ was changed while maintaining the supply amount of the source materials other than $AS_4$ and the growth temperature. It was found from FIG. 5 that the conditions of supplying $As_4$ influences the crystal growth in addition to the supply amount of Al and the growth temperature. FIG. 5 also shows the pattern of surface reconstruction obtained from the results of a RHEED observation during the growth. Under the growth conditions of supplying an excessive amount of $As_4$ which results in a surface reconstruction of (2×4) (about 75% of the crystal growth surface was covered with arsenic and nitrogen as group V elements), the nitrogen-mix crystal ratio was small. By contrast, under the growth conditions which result in a surface reconstruction of (3×1) (about 40% of the crystal growth surface was covered with arsenic and nitrogen), the nitrogen-mix crystal ratio increased by an amount equal to or more than the amount of an increase caused by the N/As ratio when the source materials were supplied. Under the conditions containing a small amount of As which results in a surface reconstruction of (4×2) (0% of the crystal growth surface was covered with arsenic and nitrogen), the surface of the resultant film was very rough due to generation of Ga droplets.

It is appreciated from the above that decomposition of DMeHy at the surface of the crystal as a nitrogen source material and adsorption of the nitrogen atoms obtained by decomposition vary in accordance with the degree of exposure of the group III atoms to the surface during the growth. In the optimum growth conditions, the group III atoms are exposed on at least a half of the surface (60% in Example 1) and the group III atoms do not generate an excessive amount of droplets. In the case of AlGaAsN in Example 1, a surface reconstruction of (3×1) was obtained in the optimum growth conditions. This was also true with the growth of GaAsN without Al (not shown), but was especially noticeable when Al was contained as a group III element.

In the above examples, AlGaAs/AlGaNAs/AlGaAs structures were produced. The upper and lower barrier layers may be formed of AlGaAs, containing GaAs, having a different Al-mix crystal ratio, GaInP, InGaAsP, AlGaInP or other materials.

In the above examples, a substrate having a {100} plane as a principal plane was used. A substrate having an arbitrary, but appropriate plane orientation is usable. For example, a substrate having {n11}A and B planes (n=1, 2, 3, 4 . . . ), a {110} plane, or a plane obtained by inclining these planes at 2 to 15 degrees in an arbitrary direction is usable.

As described above, according to a method for forming a compound semiconductor layer of the present invention, the crystal growth temperature of a group III–V compound semiconductor material containing both nitrogen and arsenic as group V elements can be higher (600° or higher and 750° C. or lower) than that by the conventional methods. Even when the crystal growth temperature is as high as described above, it is possible to introduce a sufficient amount of nitrogen or indium so as to grow a crystal having satisfactory crystallinity and especially satisfactory light emission characteristics. Especially even at a temperature as high as the temperature range suitable for growing AlGaAs, GaInP, InGaAsP and AlGaInP having satisfactory crystallinity, the introduction amount of nitrogen (nitrogen-mix crystal ratio) is not reduced. Therefore, the present invention is suitable for producing a multi-layer film structure including AlGaAs as a layer on at least one surface of a group III–V semiconductor material layer which both contains nitrogen and arsenic as group V elements. Additionally, when nitrogen is introduced utilizing a decomposition reaction of a nitrogen compound source material on the substrate surface, decomposition efficiency and the introduction efficiency of the nitrogen source material are significantly improved owing to the presence Al, which has a high reactivity, on the surface of the substrate.

The above-described functions and effects were provided only when a small amount of Al was added to the GaAsN layer to be produced. Such special functions and effects obtained by the addition of Al were not provided when indium (In) as a group III element, or phosphorus (P) or antimony (Sb) as a group V element was added. The concurrent addition of Al and In provides another effect of suppressing thermal evaporation of In, which has a high pressure when vaporized and thus is easily evaporated. This is convenient for precisely controlling an In composition in mixed-crystal materials containing In.

EXAMPLE 15

In this example, as in Example 1, a multi-layer film 10 having a single quantum well structure is crystal-grown on a GaAs substrate 1 using a CBE (chemical beam epitaxy) method. The multi-layer film 10 includes an $Al_{0.3}Ga_{0.7}As$ lower barrier layer 2 having a thickness of about 0.5 μm, an $Al_{0.55}Ga_{0.95}N_{0.05}As_{0.95}$ well layer (light emission layer) 3 having a thickness of about 7 nm, and an $Al_{0.3}Ga_{0.7}As$ upper barrier layer 4 having a thickness of about 0.1 μm, which are laminated.

Hereinafter, a method for forming a compound semiconductor layer in this example will be described. The method is different from the conventional methods in that in this example, one process cycle, including the step of supplying a group III source material containing an appropriate amount of Al source material, the step of supplying a nitrogen source material to a surface of the group III source material, and the step of supplying an arsenic source material is repeated a plurality of time to perform crystal growth.

A CBE apparatus containing TMGa (trimethyl gallium), $AsH_3$ (arsine), $NH_3$ (ammonia) and TMAl (trimethyl aluminum) was used to supply these source materials to a chamber. A crystal was grown on the substrate 1 while maintaining the temperature of the GaAs substrate 1 having a {100} plane as a principal plane at 600° C. Thus, the above-described single quantum well structure was produced. The strength of each molecular beam for crystal growth by the CBE method was as follows: TMGa: about $3.5 \times 10^{-7}$ torr; TMAl: about $1.5 \times 10^{-7}$ torr for growing the barrier layers 2 and 4 and about $1.88 \times 10^{-8}$ torr for growing the well layer 3; $AsH_3$: about $8.0 \times 10^{-6}$ torr; and $HN_3$: about $1.0 \times 10^{-5}$ torr.

Throughout the crystal growth process, all the necessary source materials were concurrently supplied for growing AlGaAs for the barrier layers 2 and 4. For growing an AlGaNAs layer as the well layer 3, the source materials were alternately supplied in accordance with the sequence shown in FIG. 6. The process of alternately supplying the source materials includes step A of supplying a group III source material containing an Al source material, step B of supplying a nitrogen source material to a surface of the group III source material, and step C of supplying an arsenic source material, as one cycle.

Figure 6:
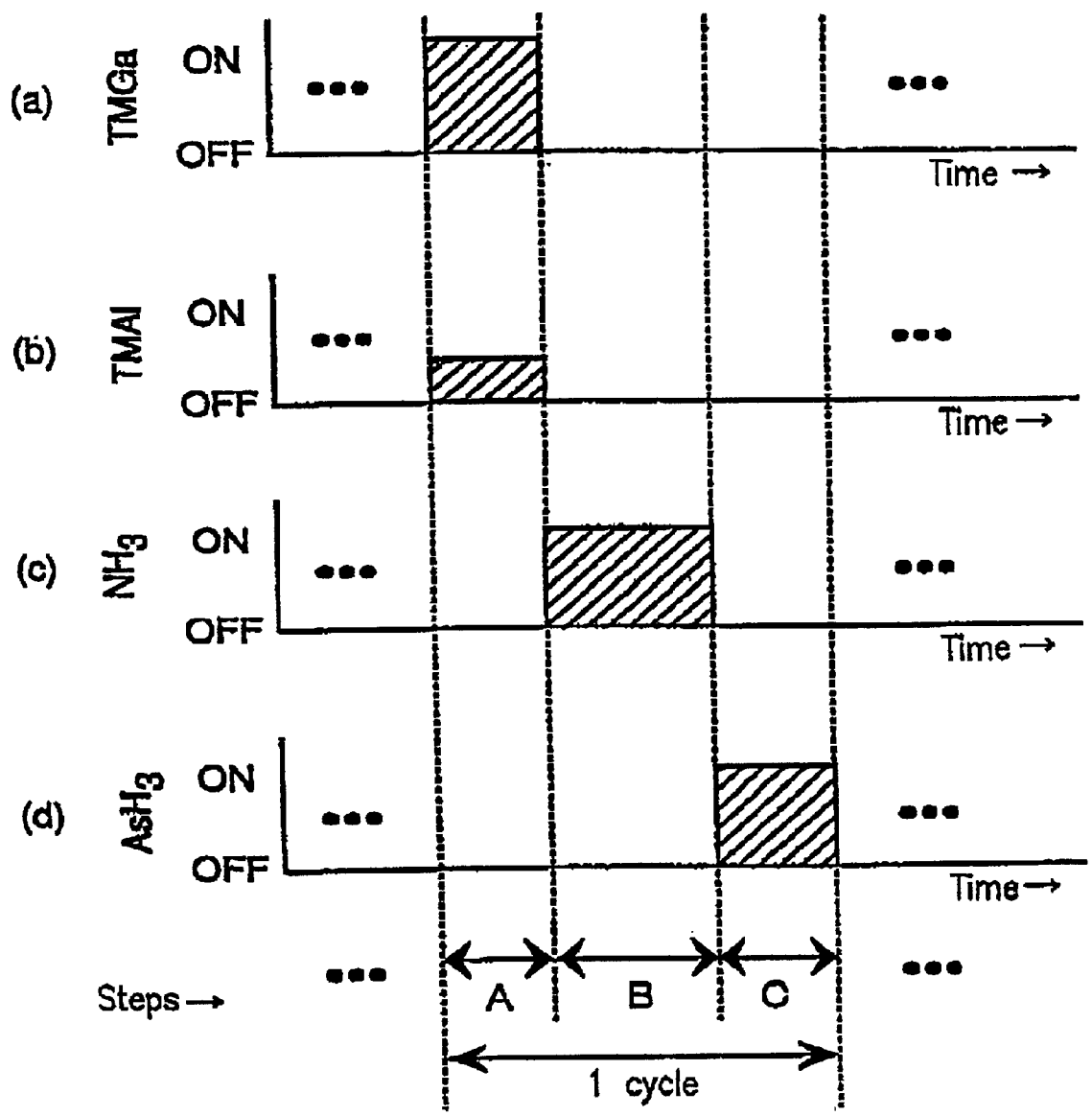
FIG. 6 is a diagram illustrating a source material supply sequence for growing a well layer in Example 15.

FIG. 6 including parts (a) through (d) is a timing diagram for supplying source material gases. After the lower barrier layer 2 was grown by concurrently supplying all the source materials, alternate supply of the source materials was begun. First, in step A, TMGa and TMAl were supplied for 2 seconds, thereby forming an end surface of the group III source material. Next, in step B, $NH_3$ was supplied for 3 seconds, thereby performing partial nitriding. Then, in step C, $AsH_3$ was supplied for 2 seconds, thereby forming one molecular layer of AlGaAsN. By repeating the process cycle including steps A through C an appropriate number of times, the AlGaNAs layer (well layer) 3 having a prescribed thickness wan obtained. Thereafter, all the source materials were concurrently supplied, thereby growing the upper barrier layer 4.

In this manner, the $Al_{0.3}Ga_{0.7}As$ lower barrier layer 2, the $Al_{0.05}Ga_{0.95}N_{0.05}As_{0.95}$ well layer (light emission layer) 3, and the $Al_{0.3}Ga_{0.7}As$ upper barrier layer 4 were sequentially crystal-grown on the GaAs substrate 1. In the light emission layer 3 of the multi-layer film 10, the aluminum-mix crystal ratio was 0.05 and the nitrogen-mix crystal ratio was 0.05. The composition of $Al_{0.05}Ga_{0.95}N_{0.05}As_{0.95}$ forming the well layer 3 has a −1% of tensile strain with respect to the GaAs substrate.

As a result of measuring photoluminescence light emission intensity of samples produced in this manner at room temperature, it was confirmed that an AlGaAs/AlGaNAs/AlGaAs quantum well having satisfactory light emission characteristics was produced. An AlGaAs/GaNAs/AlGaAs quantum well was produced by supplying a nitrogen source material by a similar method to that of this example so as to mix-crystal nitrogen in a similar amount to that of this example, but without adding Al as in the conventional methods. The introduction amount of nitrogen was lower than that of this example by one order of magnitude. The multi-layer film produced in this example showed no non-uniformity in the light emission wavelength or light emission intensity, and exhibited a high light emission intensity and a very smooth morphology of the surface of the crystal.

In this example, the group III source material, the nitrogen source material, and the arsenic source material were independently and sequentially supplied unlike in Examples 1 through 14 in which all the source materials were concurrently supplied. The growth method in this example positively utilizes that when $NH_3$ as a nitrogen source material is supplied while the group III element containing Al is on the top surface of the substrate, the thermal decomposition of $NH_3$ is promoted. By this method, the introduction efficiency of nitrogen is especially improved. The special improvement in introduction efficiency of nitrogen will be described in more detail with reference to FIG. 6.

First in step A of FIG. 6, the substrate is exposed to TMGa and TMAl capable of supplying Ga and Al, the total thickness of Ga and Al being equal to or less than the thickness of one atomic layer. The group III atom may be supplied in an any amount as long as a thickness thereof is equal to less than the thickness of one atomic layer. In the case where an organic metal compound such as, for example, TMGa or TMAl is used as a group III source material, an atomic layer epitaxy mode may be used, by which the growth steps automatically when the group III element is grown to the thickness of one atomic layer. Next, in step B, $NH_3$ is supplied. The supply time is controlled so that nitrogen is introduced in such an amount to provide a nitrogen-mix crystal ratio in solid phase of 5% (nitrogen-mix crystal ratio z=0.05). By supplying $NH_3$ in the state where the group III atoms containing active Al are exposed to the surface of the substrate, the adsorption/decomposition of $NH_3$ is promoted by a reaction at the surface. If $AsH_3$ is supplied concurrently with $NH_3$, the surface of the substrate is quickly covered with As atoms, which have a lower decomposition temperature and thus are more easily adsorbed than $NH_3$. As a result, the probability of the decomposition reaction of $NH_3$ at the surface is reduced. In step C, $AsH_3$ is independently supplied, thereby terminating the group III atoms, having no nitrogen on the substrate surface adsorbed thereto, with arsenic. $ASH_3$ is supplied in step C in an amount corresponding to 0 95 of an atomic layer. As is adsorbed only to the group III atoms which have not been bonded with nitrogen atoms on the surface of the substrate, and the other extra portion of As leaves without being adsorbed since no group III atoms are available to react. The nitrogen atoms already chemically adsorbed in step B have very large Ga—N and Al—N bonding energies. Therefore, these nitrogen atoms are not substituted with the As atoms supplied after the nitrogen atoms. Each time the process including steps A through C is performed once, an AlGaAsN layer having a thickness of one molecular layer or less is formed. For growing a thick layer, this process is repeated a plurality of times.

While a compound containing arsenic and nitrogen as group V elements (for example, GaAsN) is crystal-grown, the compound is easily phase-separated into an arsenic compound (GaAs) and a nitrogen compound (GaN). Therefore, it is difficult to grow a crystal containing arsenic and nitrogen uniformly mixed together. By supplying an arsenic source material and a nitrogen source material with a time delay therebetween as in this example, neither interference nor competition between the arsenic atoms and the adsorption site of the nitrogen atoms occurs. As a result, a crystal containing arsenic and nitrogen randomly mixed is formed. In other words, by supplying only a nitrogen source material to a surface at which active group III atoms, generated by adding an aluminum source material, are exposed, the decomposition efficiency and the introduction efficiency of the nitrogen source material are significantly improved without causing competition between the adsorption site of the nitrogen atoms and the arsenic atoms.

Regarding the plane orientation of the substrate, in light of the above-described functions of this example, a group III plane and a group V plane can be alternately exposed. A {100} plane and a plane obtained by inclining the {100} plane at 2 to 15 degrees are preferable.

In this example, the supply amounts of the source materials are controlled in terms of the supply amounts per unit time and the supply time. The supply amount of the source materials are unquestionably better controlled by controlling the supply sequence while monitoring the vibration phase of the reflection high energy electron beam diffraction (RHEED). In addition, a wait time (a time period in which no material in supplied) may be provided after each source material is supplied in order to expel the remaining material. It is especially preferable to provide a wait time after supply of a group V material, which is supplied in a relatively large amount per unit time.

In this example, an AlGaAs/AlGaNAs/AlGaAs structure was produced. The upper and lower barrier layers may be formed of AlGaAs, containing GaAs, having a different Al-mix crystal ratio, GaInP, InGaAsP, AlGaInP or other materials.

EXAMPLE 16

Figure 7:
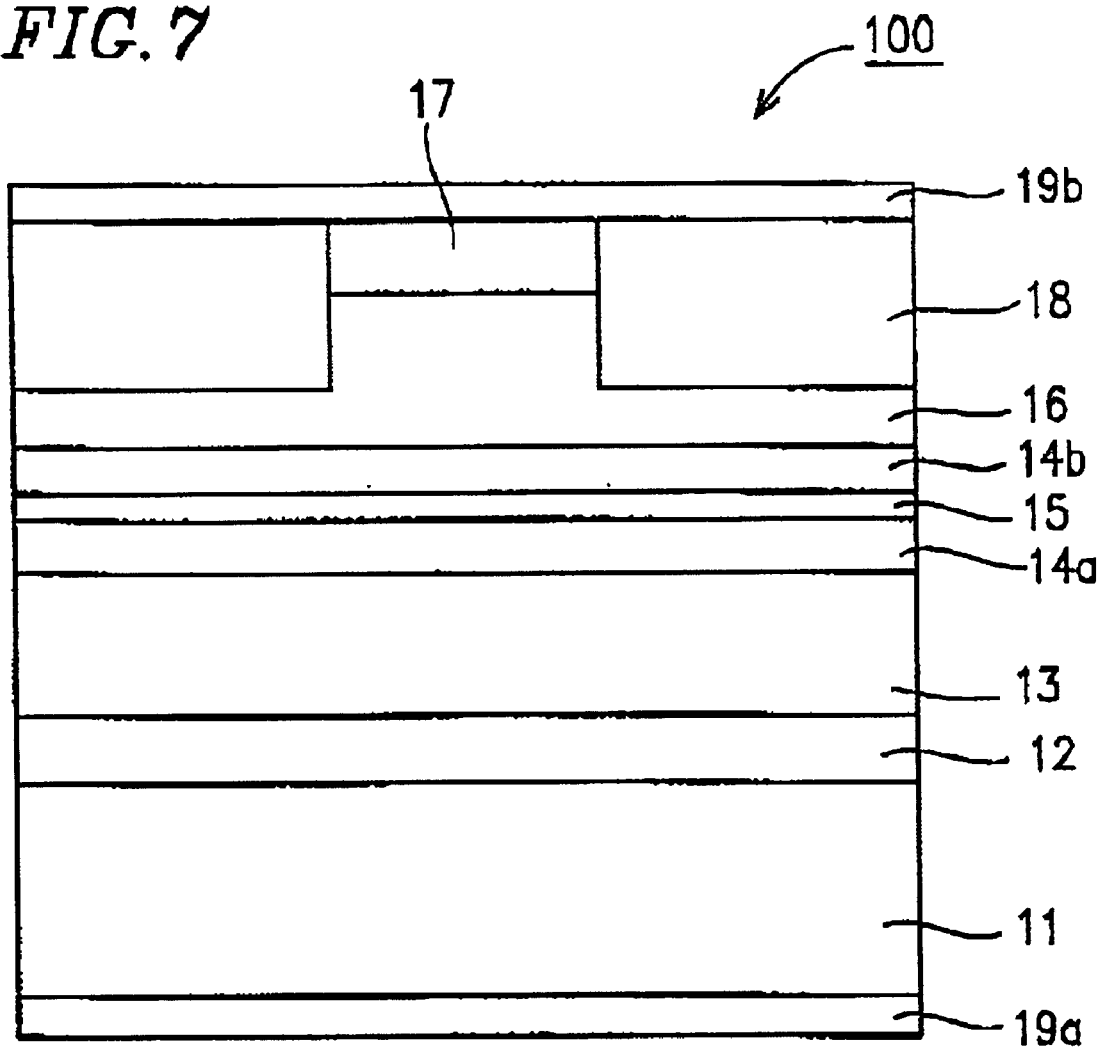
FIG. 7 is a schematic cross-sectional view of a semiconductor laser produced in Example 16 seen from a light emission surface of the laser.

In this example, a semiconductor laser 100 shown in FIG. 7 having an oscillation wavelength of 1.3 $\mu$m was produced. The wavelength of 1.3 $\mu$m, at which the dispersion in wavelength of a quartz-based optical fiber is at a minimum, is important in optical communications using an optical fiber. The semiconductor laser 100 includes an n-type GaAs substrate (300 $\mu$m) 11, an n-type GaAs buffer layer (0.5 $\mu$m) 12, an n-type $Al_{0.35}Ga_{0.65}As$ lower cladding layer (1 $\mu$m) 13, a non-doped $Al_{0.05}Ga_{0.95}As$ guide layer (0.1 $\mu$m) 14a, a non-doped $Al_{0.05}Ga_{0.64}In_{0.31}N_{0.015}As_{0.985}$ well layer (compression strain: 2%; 6 nm) 15, a non-doped $Al_{0.05}Ga_{0.95}As$ guide layer (0.1 $\mu$m) 14b, a p-type $Al_{0.35}Ga_{0.65}As$ upper cladding layer (1 $\mu$m) 16, a p-type GaAs contact layer (0.5 $\mu$m) 17, and a polyimide current constriction layer 18. The layers 12 through 17 are laminated on the GaAs substrate 11. The semiconductor laser 100 also includes an AuGe electrode metal 19a and an AuZn electrode metal 19b interposing the laminate.

Hereinafter, a method for forming a compound semiconductor layer in this example will be described. The method is different from the conventional methods in that an appropriate amount of Al source material to added during the crystal growth of a quantum well layer in this example.

An MBE apparatus containing a Ga source material, an In source material, an Al source material and an As source material as solid sources, and $NH_3$ (ammonia) as a gas source was used. The substrate 11 was irradiated with a molecular beam of each source material while maintaining the temperature of the GaAs substrate 11 having a {100} plane as a principal plane at 600° C., thereby performing crystal growth. Thus, a multi-layer film including the buffer layer 12, the lower cladding layer 13, the guide layer 14a, the well layer 15, the guide layer 14b, the upper cladding layer 16, and the contact layer 17 was produced. $NH_3$ as the gas source was supplied by performing cracking using alumina. As dopants for controlling conductivity types, solid Si was used for doping with Si, and solid Be was used for doping with Be. The growth rate was set to be 0.5 $\mu$m/time. All the necessary source materials were concurrently supplied for growing each layer. Especially in producing an AlGaInNAs layer as the well layer 15, Al and $NH_3$ were concurrently supplied.

After the multi-layer film was crystal-grown by the MBE method, the contact layer 17 and a part of the upper cladding layer 16 were etched into a stripe having a width of 3 μm, thereby forming a ridge-type waveguide structure. On side surfaces of the ridge, the current constriction layer 18 of polyimide was formed. Then, the upper and lower electrodes 19a and 19b were formed. Thus, the semiconductor laser 100 was produced.

The semiconductor laser 100 produced in this manner oscillated at room temperature at an oscillation threshold current of 20 mA to emit light having a wavelength of 1.3 μm. The characteristic temperature was 180 K. As a result of performing an aging test at 80° C. and 10 mW, the semiconductor laser device was confirmed to stably operate for 5000 hours or more.

Figure 8:
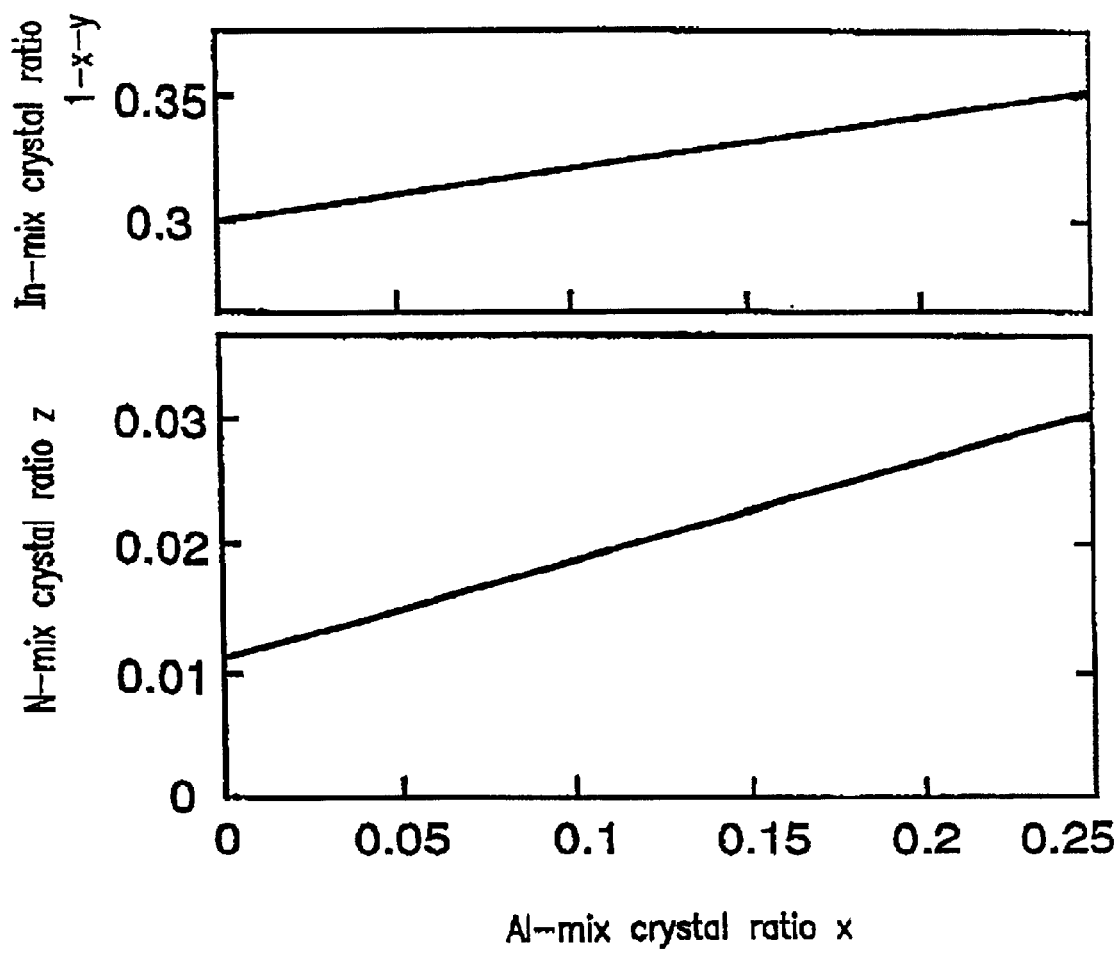
FIG. 8 is a graph illustrating the relationship between the Al, N and In-mix crystal ratios in an AlGaInNAs well layer in a semiconductor laser for emitting light having a wavelength of 1.3 μm.

When mix-crystallizing Al with a $Ga_{0.7}In_{0.3}N_{0.01}As_{0.99}$ well layer which emits light having a wavelength of 1.3 μm, expansion of the forbidden band caused by the mix-crystallization of Al can be cancelled so as to maintain the oscillation wavelength (at 1.3 μm) by increasing the nitrogen and indium-mix crystal ratios. FIG. 8 shows the relationship between the Al-mix crystal ratio x and the conditions of the nitrogen and indium-mix crystal ratios required to maintain the wavelength at 1.3 μm. It can be appreciated from FIG. 8 that when, for example, the Al-mix crystal ratio x is 0.05 as in this example, the nitrogen-mix crystal ratio needs to be increased to about 1.36 times higher than the case in which Al is not mix-crystallized.

In this example, $Al_{0.35}Ga_{0.65}As$ was used for the cladding layers, and $Al_{0.05}Ga_{0.95}As$ was used for the guide layers. The cladding layers, the guide layers and the barrier layers may be formed of a material which can be represented as $Al_hGa_iIn_{1-h-i}As_jP_{1-j}$ (h≧0, i>0, j≧0), for example, AlGaAs, containing GaAs, having a different Al-mix crystal ratio, GaInP, InGaAsP, AlGaInP or other materials, since these materials have an optimum growth temperature in the optimum growth temperature range for AlGaInNAs used for the well layer.

Comparative Example 15

A semiconductor laser for emitting light having a wavelength of 1.3 μm was produced in a similar manner to that of Example 16 except that the well layer 15 in FIG. 7 was formed of $Ga_{0.7}In_{0.3}N_{0.01}As_{0.95}$ which does not contain Al and that crystal growth was performed at a growth temperature of 500° C. in order to introduce nitrogen. In this case, the oscillation threshold was 65 mA and the characteristic temperature was 105 K, which were inferior to those of the semiconductor laser device in Example 16. The reason in that when Al to not contained in the well layer, crystal growth needs to be performed at a temperature which is relatively low as the growth temperature of a group III–V compound, in order to introduce nitrogen. It is considered that the crystal of the well layer did not have satisfactory crystallinity and thus sufficient optical gain was not obtained due to such a low growth temperature.

Figure 9:
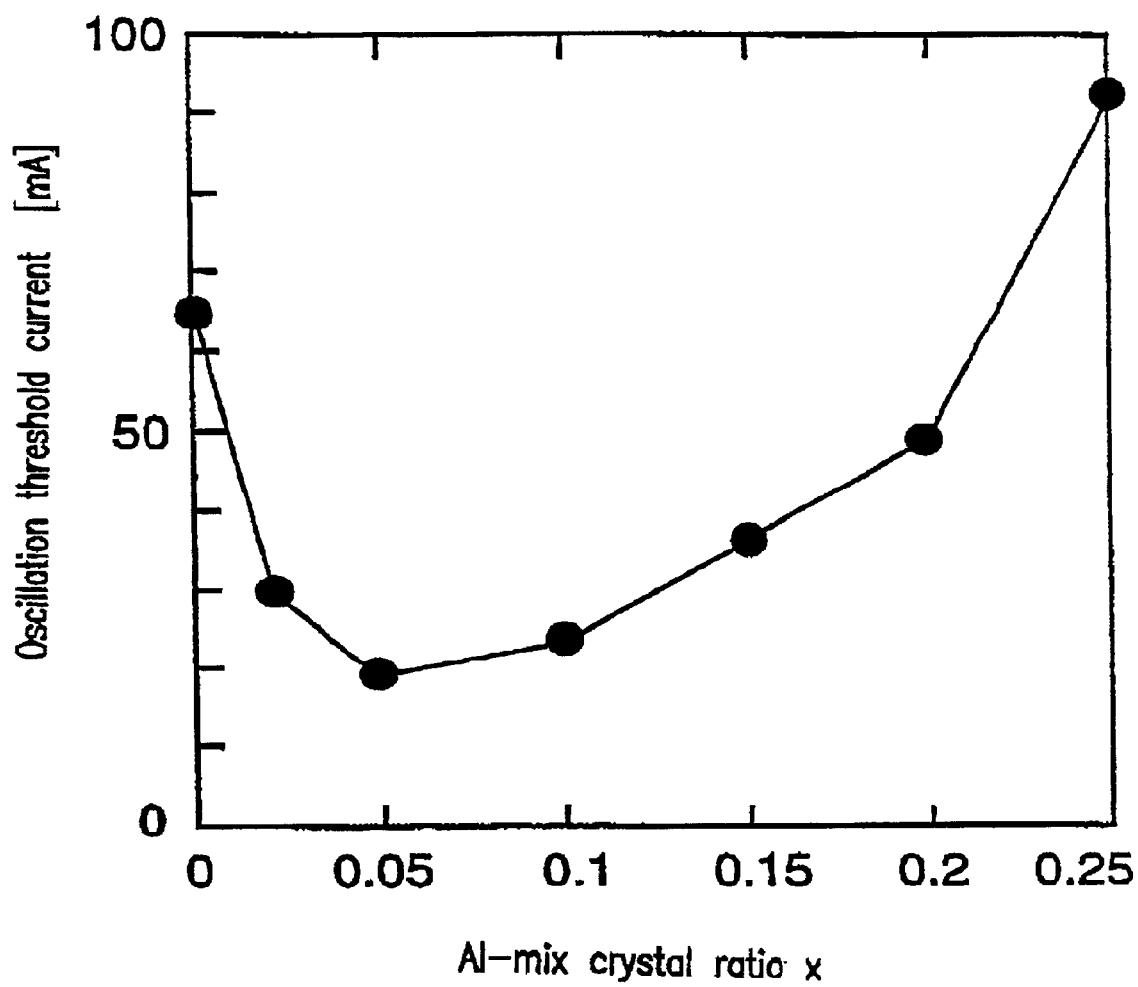
FIG. 9 is a graph illustrating the dependency of oscillation threshold current of a semiconductor laser produced in Example 16 on the Al-mix crystal ratio in a well layer of the semiconductor laser.

FIG. 9 is a graph illustrating the oscillation threshold current of the semiconduotor laser in Example 16 having an Al-mix crystal ratio of 0.05 in the well layer, and semiconductor lasers having a structure similar to that of the semiconductor laser in Example 16 except having an Al-mix crystal ratio of 0, 0.02, 0.1, 0.15, 0.2 and 0.25 in the well layer. For each semiconductor laser, the nitrogen-mix crystal ratio and the indium-mix crystal ratio were adjusted in accordance with the relationship shown in FIG. 8 in order to maintain the oscillation wavelength at 1.3 μm. For the device having an Al-mix crystal ratio of zero, crystal growth was performed at a growth temperature of 500° C. in order to introduce nitrogen.

In general, when nitrogen is mix-crystallized with an arsenic compound, the crystallinity is drastically deteriorated as the nitrogen-mix crystal ratio increases. However, the devices produced by the method of the present invention with an Al-mix crystal ratio in the range of 0.02 to 0.20 exhibited an oscillation threshold current lower than that of a device produced with an Al-mix crystal ratio of zero, despite the increased nitrogen-mix crystal ratio as the Al-mix crystal ratio increased. The devices produced with an Al-mix crystal ratio in the range of 0.02 to 0.10 were especially superior with an oscillation threshold current being half or less of that of a device produced by the conventional methods. A device produced with an Al-mix crystal ratio x of 0. 25 exhibited an oscillation threshold current which was higher than that of a device produced by the conventional methods. As Can be appreciated from FIG. 8, the nitrogen-mix crystal ratio in the well layer of the device produced with an Al-mix crystal ratio x of 0.25 was about three times higher than that of the device produced with an Al-mix crystal ratio of zero. Such a deterioration in the crystallinity caused by an increase in the nitrogen-mix crystal ratio resulted in a decline in the device characteristics.

In Example 16, the semiconductor laser for emitting light at a wavelength of 1.3 μm was produced. The oscillation wavelength is not limited to 1.3 μm, but can be arbitrarily selected to be, for example, 1.2 μm or 1.55 μm in accordance with the intended application. In this example, a surface emission semiconductor laser having a Fabry-Perot resonator is described. A distributed feedback semiconductor laser, a distributed reflection semiconductor laser, a vertical resonator surface emission laser, or a light-emitting diode, for example, can be similarly structured. As the active layer, a strained quantum well active layer having a compression strain was described. The direction and amount of strain can be arbitrarily selected. The active layer may be a bulk active layer, a quantum fine line active layer, or a quantum box active layer.

EXAMPLE 17

A multi-layer film having a structure shown in FIG. 1 was produced in a similar manner to that of Example 1 except that the upper barrier and the lower barrier layer were formed of $Ga_{0.31}In_{0.45}P$ which is lattice-matched to the GaAs substrate and that the substrate temperature was set to be 600° C. The substrate temperature was kept constant while crystal growth was performed to form the multi-layer film.

EXAMPLE 18

A multi-layer film having a structure shown in FIG. 1 was produced in a similar manner to that of Example 1 except that the upper barrier and the lower barrier layer were formed of $(Al_{0.3}Ga_{0.7})_{0.5}In_{0.5}P$ which is lattice-matched to the GaAs substrate and that the substrate temperature was set to be 600° C. The substrate temperature was kept constant while crystal growth was performed to form the multi-layer film.

EXAMPLE 19

A multi-layer film having a structure shown in FIG. 1 was produced in a similar manner to that of Example 1 except that the upper barrier and the lower barrier layer were formed of $In_{0.43}Ga_{0.57}As_{0.2}P_{0.8}$ which is lattice-matched to the GaAs substrate and that the substrate temperature was set to be 600° C. The substrate temperature was kept constant while crystal growth was performed to form the multi-layer film.

In the single quantum well in Examples 17 through 19, the photoluminescence light emission intensity from the $Al_{0.05}Ga_{0.95}N_{0.015}As_{0.055}$ well layer was substantially equal to that in Examples 1 through 16 in which the barrier layers were formed of AlGaAs.

In all of the above examples, an appropriate material is usable as the Ga source material, In source material, Al source material and As source material. For example, usable Ga source materials include organic metal compounds such as, for example, metal Ga, TMGa and TEGa (triethyl gallium) and chlorides such as, for example, $GaCl_3$. Usable In source materials include, for example, organic metal compounds such as, for example, metal In and TMIn. Usable Al source materials include, for example, organic metal compounds such as, for example, metal Al and TMAl. Usable As source materials include, for example, organic metal compounds such as, for example, $As_4$ and $As_2$ obtained from metal As and TMAs (trimethyl arsine), and hydrides such as, for example, $AsH_3$.

In the above examples, ammonia is used as a nitrogen source material. The effect of the decomposition of the source material being promoted at the surface of an active crystal containing Al can be similarly provided by other nitrogen source materials including ammonia and organic compounds thereof represented by:

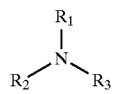

or hydrazine and organic compounds thereof represented by:

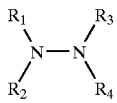

In the above formulas, $R_1$, $R_2$, $R_3$ and $R_4$ are each hydrogen or a lower alkyl group. Alternatively, a nitrogen compound containing nitrogen atoms which are radical-excited is usable as the nitrogen source material. According to the present invention, these materials can be crystal-grown at a higher temperature than in the conventional methods, and thus nitrogen atoms can be introduced with high efficiency. The source materials to be supplied may contain indium (In) as a group III element and phosphorus (P) as a group V element. Specifically, since In has a high pressure when vaporized and is easily thermally evaporated, concurrent addition of Al and In is convenient since it provides another effect of suppressing thermal evaporation of In.

In the above example, compound semiconductors appropriately containing Ga, In and Al as group III elements and As and N as group V elements are shown. Other group III elements (for example, B), other group V elements (for example, Sb and P), and impurity elements (for example, Zn, Be, Mg, Te, S, Se and Si) can be appropriately contained.

In all of the above examples, GaAs is used as the material for the substrate. The material for the substrate is not limited to GaAs. Other materials can be used to provide similar effects. For example, other group III–V compound semiconductor substrates such as an InGaAs substrate, group II–VI compound semiconductor substrates such as a ZnS substrate, and group IV compound semiconductor substrates such as a Ga substrate are usable.

In the above examples, the MBE method and the CBE method are used as the method for crystal growth. An MO-MBE (metal organic molecular beam epitaxy) method, a GS-MBE (gas source molecular beam epitaxy) method, an MOCVD method, a hydride VPE method, and a chloride VPE method can be used to provide similar effects.

Throughout this specification, the term "upper" refers to a position farther from the substrate, and the term "lower" refers to a position closer to the substrate. Crystal growth proceeds in the direction from "lower" to "upper".

The present invention is not limited to the above-described combinations of crystal composition, band gap wavelength, and hetero junction. Needless to say, the present invention to applicable to production of a group III–V compound semiconductor mixed-crystal having other compositions and bandgaps, which contains both nitrogen (N) and arsenic (As) an group V elements. The present invention is not limited to a structure in which the grown layers are lattice-matched to the crystal of the substrate. The grown layers may contain a material which to lattice-mismatched to the crystal of the substrate so long as crystal defects are not induced. For example, a strained quantum well structure of a semiconductor laser can be used.

INDUSTRIAL APPLICABILITY

The present invention provides a method for forming a compound semiconductor formed of group III–V semiconductor materials containing group III–V compound semiconductors which contain arsenic as a group V element, and also containing nitrogen mix-crystallized therewith, and specifically a method for forming a crystal having satisfactory light emission characteristics. More specifically, even when the growth temperature is increased to be substantially as high as the optimum crystal growth temperature for AlGaAs or the like, a sufficient amount of nitrogen can be mix-crystallized. Accordingly, a method for forming a compound semiconductor layer which is convenient to a structure for light emitting devices, including semiconductor lasers can be provided. In addition, a compound semiconductor device having superb characteristics can be provided by applying the formation method of the present invention. Especially, a compound semiconductor film having crystallinity and light emission characteristics which are sufficient for a light emission layer of a light emitting device can be produced. Thus, a device having superb light emission characteristics, light emission efficiency, and device life can be provided.

What is claimed is:

1. A method for forming a compound semiconductor layer, comprising the step of crystal-growing a group III–V compound semiconductor layer containing at least nitrogen and arsenic as group V elements on a single crystal substrate,
   wherein the step of crystal-growing the compound semiconductor layer includes the step of supplying an aluminum source material to the single crystal substrate concurrently with a nitrogen source material such that the source materials decompose on the surface of the substrate.

2. A method for forming a compound semiconductor layer according to claim 1, wherein an aluminum-mix crystal ratio in a group III element in the compound semiconductor layer is 0.02 or higher and 0.20 or lower.

3. A method for forming a compound semiconductor layer according to claim 1, wherein the step of crystal-growing the compound semiconductor layer is performed at a temperature of the single crystal substrate in the range of 500° C. or higher and 750° C. or lower.

4. A method for forming a compound semiconductor layer according to claim 1, wherein the nitrogen source material is $NH_3$.

5. A method for forming a compound semiconductor layer according to claim 1, wherein more than 0% and less than 50% of the crystal growth surface of the compound semiconductor layer is covered with group V atoms.

6. A method for forming a compound semiconductor layer according to claim 1, further comprising the step of crystal-growing a layer formed of $Al_hGa_iIn_{1-h-i}As_jP_{1-j}$ ($h \geq 0$, $i > 0$, $j \geq 0$) on the single crystal substrate, wherein the step of crystal-growing the compound semiconductor layer and the step of growing the crystal formed of $Al_hGa_iIn_{1-h-i}As_jP_{1-j}$ are performed at the same temperature.

7. A method for forming a compound semiconductor layer according to claim 6, wherein the step of crystal-growing the compound semiconductor layer is performed after the step of crystal-growing the layer formed of $Al_hGa_iIn_{1-h-i}As_jP_{1-j}$.

8. A method for forming a compound semiconductor layer according to claim 6, wherein the step of crystal-growing the compound semiconductor layer is performed before the step of crystal-growing the layer formed of $Al_hGa_iIn_{1-h-i}As_jP_{1-j}$.

9. A method for forming a compound semiconductor layer according to claim 1, wherein the compound semiconductor layer further contains indium.

10. A method for forming a compound semiconductor layer, comprising the step of crystal-growing a group III–V compound semiconductor layer containing at least nitrogen and arsenic as group V elements on a single crystal substrate,
wherein the step of crystal-growing the compound semiconductor layer includes the step of supplying a nitrogen source material to the single crystal substrate so that the nitrogen source material interacts with aluminum at least on a crystal growth surface of the compound semiconductor layer.

11. A method for forming a compound semiconductor layer according to claim 10, wherein an aluminum-mix crystal ratio in a group III element in the compound semiconductor layer is 0.02 or higher and 0.20 or lower.

12. A method for forming a compound semiconductor layer according to claim 10, wherein the step of crystal-growing the compound semiconductor layer is performed at a temperature of the single-crystal substrate in the range of 500° C. or higher and 750° C. or lower.

13. A method for forming a compound semiconductor layer according to claim 10, wherein the nitrogen source material is $NH_3$.

14. A method for forming a compound semiconductor layer according to claim 10, wherein more than 0% and less than 50% of the crystal growth surface of the compound semiconductor layer is covered with group V atoms.

15. A method for forming a compound semiconductor layer according to claim 10, further comprising the step of crystal-growing a layer formed of $Al_hGa_iIn_{1-h-i}As_jP_{1-j}$ ($h \geq 0$, $i > 0$, $j \geq 0$) on the single crystal substrate, wherein the step of crystal-growing the compound semiconductor layer and the step of growing the crystal formed of $Al_hGa_iIn_{1-h-i}As_jP_{1-j}$ are performed at the same temperature.

16. A method for forming a compound semiconductor layer according to claim 15, wherein the step of crystal-growing the compound semiconductor layer is performed after the step of crystal-growing the layer formed of $Al_hGa_iIn_{1-h-i}As_jP_{1-j}$.

17. A method for forming a compound semiconductor layer according to claim 15, wherein the step of crystal-growing the compound semiconductor layer is performed before the step of crystal-growing the layer formed of $Al_hGa_iIn_{1-h-i}As_jP_{1-j}$.

18. A method for forming a compound semiconductor layer according to claim 10, wherein the compound semiconductor layer further contains Indium.

19. A method for forming a compound semiconductor layer, comprising the step of crystal-growing a group III–V compound semiconductor layer containing at least nitrogen and arsenic as group V elements on a single crystal substrate,
wherein the step of crystal-growing the compound semiconductor layer includes the step of supplying a nitrogen source material to a crystal surface of the compound semiconductor layer in a state where the group III atoms containing aluminum are exposed to the crystal surface such that the nitrogen source material decomposes on the surface of the substrate.

20. A method for forming a compound semiconductor layer according to claim 19, wherein an aluminum-mix crystal ratio in a group III element in the compound semiconductor layer is 0.02 or higher and 0.20 or lower.

21. A method for forming a compound semiconductor layer according to claim 19, wherein the step of crystal-growing the compound semiconductor layer is performed at a temperature of the single-crystal substrate in the range of 500° C. or higher and 750° C. or lower.

22. A method for forming a compound semiconductor layer according to claim 19, wherein the nitrogen source material is $NH_3$.

23. A method for forming a compound semiconductor layer according to claim 19, wherein more than 0% and less than 50% of the crystal growth surface of the compound semiconductor layer is covered with group V atoms.

24. A method for forming a compound semiconductor layer according to claim 19, wherein the step of crystal-growing the compound semiconductor layer further includes the step of supplying a group III source material containing aluminum and the step of supplying an arsenic source material, wherein a process sequentially including the step of supplying the group III source material, the step of supplying the nitrogen source material, and the step of supplying the arsenic source material is performed at least once.

25. A method for forming a compound semiconductor layer according to claim 24, wherein the single crystal substrate has a {100} plane as a principal plane.

26. A method for forming a compound semiconductor layer according to claim 19, further comprising the step of crystal-growing a layer formed of $Al_hGa_iIn_{1-h-i}As_jP_{1-j}$ ($h \geq 0$, $i > 0$, $j \geq 0$) on the single crystal substrate, wherein the step of crystal-growing the compound semiconductor layer and the step of growing the crystal formed of $Al_hGa_iIn_{1-h-i}As_jP_{1-j}$ are performed at the same temperature.

27. A method for forming a compound semiconductor layer according to claim 26, wherein the step of crystal-growing the compound semiconductor layer is performed after the step of crystal-growing the layer formed of $Al_hGa_iIn_{1-h-i}As_jP_{1-j}$.

28. A method for forming a compound semiconductor layer according to claim 26, wherein the step of crystal-growing the compound semiconductor layer is performed before the step of crystal-growing the layer formed of $Al_hGa_iIn_{1-h-i}As_jP_{1-j}$.

29. A method for forming a compound semiconductor layer according to claim 19, wherein the compound semiconductor layer further contains indium.

30. A compound semiconductor apparatus, comprising at least one group III–V compound semiconductor layer containing at least aluminum as a group III element and containing at least nitrogen and arsenic as group V elements; and
wherein the compound semiconductor apparatus is a light emitting device including at least a light emitting layer, and the light emitting layer includes the compound semiconductor layer; and
wherein the light emitting layer is formed of $Al_xGa_yIn_{1-x-y}N_zAs_{1-z}$ ($0 < x, y, z < 1$), wherein an Al-mix crystal ratio x in the light emitting layer is 0.02 or higher and 0.20 or lower.

31. A compound semiconductor apparatus according to claim 30, wherein the light emitting device further includes a cladding layer, a guide layer and/or a barrier layer formed of $Al_hGa_iIn_{1-h-i}As_jP_{1-j}$ ($h \geq 0$, $i > 0$, $j \geq 0$).

* * * * *